April 27, 1965 F. BREGMAN 3,181,079

SERIES ENERGIZED TRANSISTORISED AMPLIFIER HAVING
A HIGH INPUT RESISTANCE

Filed Nov. 10, 1960 2 Sheets-Sheet 1

INVENTOR
FRANK BREGMAN
BY
Frank R. Jifani
AGENT

INVENTOR.
FRANK BREGMAN
BY
Frank R. Trifari
AGENT

United States Patent Office 3,181,079
Patented Apr. 27, 1965

3,181,079

SERIES ENERGIZED TRANSISTORISED AMPLIFIER HAVING A HIGH INPUT RESISTANCE

Frank Bregman, Emmasingel, Eindhoven, Netherlands, assignor to North American Philips Company, Inc., New York, N.Y., a corporation of Delaware Filed Nov. 10, 1960, Ser. No. 68,561
Claims priority, application Germany, Dec. 18, 1959, N 17,660
6 Claims. (Cl. 330—18)

This invention relates to transistorized amplifiers having a high internal input resistance, wherein the signal is supplied to the base of a first transistor connected as a common emitter amplifier.

Due to this arrangement, the internal input resistance of the transistor is increased substantially by a value equal to the $\alpha'$-fold of the external resistance of the emitter, wherein $\alpha'$ represents the base-collector-current gain of the transistor. The value of the external resistance of the emitter is, however, limited to a predetermined maximum value for practical reasons.

An object of the invention is to increase further the internal input resistance of the transistor. It is characterized in that the collector of the first transistor is connected directly to the emitter of a second transistor, that the base of the second transistor for the signals is connected to the emitter of the first transistor, and that the emitter of the second transistor for the signals is connected to a tapping on the emitter resistor of the first transistor.

In order that the invention may be readily carried into effect, the invention will now be described in detail, by way of example, with reference to the accompanying diagrammatic drawing, in which.

Figure 1:
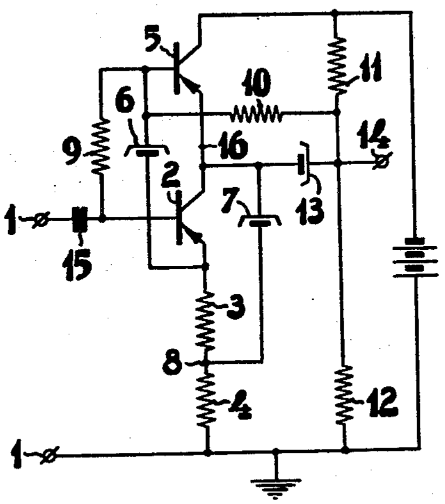
FIG. 1 is a circuit diagram of a transistor amplifier according to the invention.

The signal oscillations to be amplified from a high-ohmic signal source, for example from a part to be tested (sample) in a measuring arrangement, a photo-multiplicator tube, a camera tube or the like, are supplied through input terminals 1 to a transistor 2, as shown in FIG. 1. The amplifier 2 is connected as a common emitter amplifier so that the voltage set up at the external resistor of the emitter is substantially equal to the voltage on the base of transistor 2. The external resistor of the emitter is constituted by two partial resistors 3 and 4.

According to the invention, there is a second transistor amplifier 5, the base of which is connected through a blocking capacitor 6 to the emitter of transistor 2 and the emitter of which is connected through a blocking capacitor 7 to a junction point 8 of the resistors 3 and 4. The emitter-collector paths of the transistors 2 and 5 are traversed in series by the supply current due to direct-current coupling between the collector of transistor 2 and the emitter of transistor 5, which considerably adds to simplification of the circuit.

Due to the arrangement of the capacitors 6 and 7 in accordance with the invention, the signal voltages set up at the base and the emitter of transistor 5, and also at the collector and the emitter of transistor 2, are substantially equal to the signal voltage at the base of transistor 2. This voltage is transmitted through capacitor 7 to the tapping point 8 on the emitter resistor 3, 4 so that the partial resistor 3 is apparently multiplied by a high factor. An internal input resistance of the amplifier of many megohms, for example 10 megohms is thus made possible.

Figure 2:
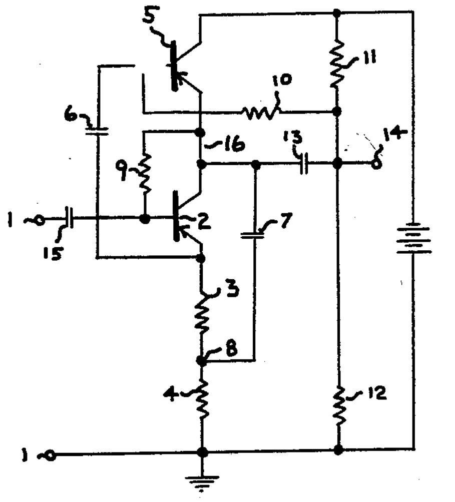
FIG. 2 is a circuit diagram of a modification of the circuit of FIG. 1.

The supply of the bases of the transistors 2 and 5 with bias current causes difficulty, since the resistors required between the bases and the source of supply become active parallel to the input terminals 1—1. According to a further feature of the invention, the base of transistor 2 is connected through a resistor 9 to the base of transistor 5, which has the required bias current supplied to it through resistors 10, 11 and 12. Since the base of transistor 5 varies with the signal voltage due to its being coupled through the capacitor 6 to the emitter of transistor 2, the resistor 9, likewise apparently increased by a high factor, becomes manifest in the internal input resistance of the amplifier. The resistor 9 may alternatively be arranged between the base of transistor 2 and the emitter of transistor 5, as shown in FIG. 2, in which event this factor is slightly reduced. Similarly, the value of resistor 10 is apparently increased by coupling the emitter of transistor 5 through a blocking capacitor 13 to an output terminal 14. Optimum results are obtained if the resistors 9 and 10 are arranged, in series with the blocking capacitors 6 and 13, respectively, between the two electrodes of the transistors 2 and 5, respectively, which show the slightest difference in signal voltage (i.e. between the base and emitter electrodes).

In one practical embodiment use was made of the following circuit elements:

Transistors:
- 2=OC 44
- 5=OC 44

Capacitors:
- 6=50 μfs.
- 7=50 μfs.
- 13=50 μfs.
- 15=0.1 μf.

Resistors:
- 3=1.8K ohms
- 4=2.2K ohms
- 9=56K ohms
- 10=22K ohms
- 11=10K ohms
- 12=22K ohms The supply voltage was 15 volt. The signal oscillations to be amplified were located in a frequency range of from 10 c./sec. to 10 mc./sec. The current amplification obtained was 3600-fold and the internal input resistance was 6 megohms.

Figure 3:
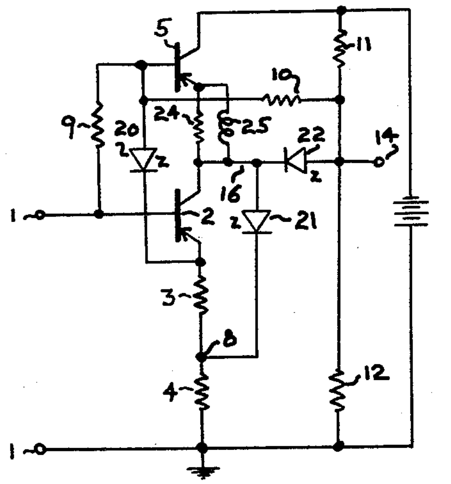
FIG. 3 is a circuit diagram of a further modification of the circuit of FIG. 1.

If direct voltages are to be amplified, the blocking capacitors 6, 7 and 13 may be replaced by Zener diodes 20, 21 and 22, respectively, as shown in FIG. 3. In this case the blocking capacitor 15 must be omitted. If the signal source connected between the input terminals 1—1 has a low internal resistance, it may be preferable, for example in order to obtain a flat frequency response curve, to include the parallel combination of a resistor 24 (for example of several hundreds of ohms) and an inductance coil 25 (for example of several tens of μh.) in the lead 16 connecting the collector of transistor 2 and the emitter of transistor 5.

What is claimed is:

1. A transistor amplifier circuit having a high input resistance, comprising first and second transistors each having a base, emitter and collector electrode, a source of operating voltage having first and second terminals, first and second resistors, means connecting the collector of said second transistor to said first terminal, means connecting the emitter of said second transistor to the collector of said first transistor, means serially connecting said first and second resistors between said second terminal and the emitter of said first transistor, a source of signals, means applying said signals between the base of said first transistor and said second terminal, signal conducting means for connecting the base electrode of said second transistor to the emitter electrode of said first transistor whereby the signals applied to the two base electrodes are in phase, signal conducting means for connecting the emitter electrode of said second transistor to the junction of said first and second resistors, and means for providing a bias for said first transistor comprising a third resistor, and means connecting said third resistor between the base electrode of said first transistor and another point on said circuit having a signal voltage substantially equal to and in phase with the signal voltage at the base of said first transistor whereby said in phase signal voltage provides the sole biasing potential for the base electrode of said first transistor.

2. The circuit of claim 1, in which said signal conducting means are capacitors.

3. A transistor amplifier circuit having a high input resistance, comprising first and second transistors each having a base, emitter and collector electrode, a source of operating voltage having first and second terminals, first and second resistors, means connecting the collector of said second transistor to said first terminal, means connecting the emitter of said second transistor to the collector of said first transistor, means serially connecting said first and second resistors between said second terminal and the emitter of said first transistor, a source of signals, means applying said signals between the base of said first transistor and said second terminal, first capacitor means connected between the emitter of said first transistor and the base of said second transistor, second capacitor means connected between the emitter electrode of said second transistor and the junction of said first and second resistors, and means for providing a base bias for said first transistor comprising a third resistor, and means for connecting said third resistor between the base electrode of said first transistor and an electrode of said second transistor having a signal voltage substantially equal to and in phase with the signal voltage at the base of said first transistor whereby said in phase signal voltage provides the sole biasing potential for the base electrode of said first transistor.

4. A transistor amplifier circuit having a high input resistance, comprising first and second transistors each having a base, emitter and collector electrode, a source of operating voltage having first and second terminals, first and second resistors, means connecting the collector of said second transistor to said first terminal, means connecting the emitter of said second transistor to the collector of said first transistor, means serially connecting said first and second resistors between said second terminal and the emitter of said first transistor, a source of signals, means applying said signals between the base of said first transistor and said second terminal, first capacitor means connected between the emitter of said first transistor and the base of said second transistor, second capacitor means connected between the emitter electrode of said second transistor and the junction of said first and second resistors, and means for providing a base bias for said first transistor comprising a third resistor, and means for connecting said third resistor between the base of said first transistor and the base of said second transistor whereby said base of said first transistor is biased solely by the in phase signal voltage present at the base of said second transistor.

5. A transistor amplifier circuit having a high input resistance, comprising first and second transistors each having a base, emitter and collector electrode, a source of operating voltage having first and second terminals, first and second resistors, means connecting the collector of said second transistor to said first terminal, means connecting the emitter of said second transistor to the collector of said first transistor, means serially connecting said first and second resistors between said second terminal and the emitter of said first transistor, a source of signals, means applying said signals between the base of said first transistor and said second terminal, first capacitor means connected between the emitter of said first transistor and the base of said second transistor, second capacitor means connected between the emitter electrode of said second transistor and the junction of said first and second resistors, and means for providing a base bias for said first transistor comprising a third resistor, and means for connecting said third resistor between the base of said first transistor and the emitter of said second transistor.

6. A transistor amplifier circuit having a high input resistance, comprising first and second transistors each having a base, emitter and collector electrode, a source of operating voltage having first and second terminals, first and second resistors, means connecting the collector of said second transistor to said first terminal, means connecting the emitter of said second transistor to the collector of said first transistor, means serially connecting said first and second resistors between said second terminal and the emitter of said first transistor, a source of signals, means applying said signals between the base of said first transistor and said second terminal, a Zener diode for connecting the base electrode of said second transistor to the emitter electrode of said first transistor whereby the signals applied to the two base electrodes are in phase, a Zener diode for connecting the emitter electrode of said second transistor to the junction of said first and second resistors, and means for providing a bias for said first transistor comprising a third resistor, and means connecting said third resistor between the base electrode of said first transistor and another point on said circuit having a signal voltage substantially equal to and in phase with the signal voltage at the base of said first transistor.

References Cited by the Examiner

UNITED STATES PATENTS

| | | | |
|---|---|---|---|
| 2,926,307 | 2/60 | Ehret | 330—18 |
| 2,929,997 | 3/60 | Cluwen | 330—18 |

FOREIGN PATENTS

| | | |
|---|---|---|
| 813,944 | 5/59 | Great Britain. |
| 1,026,361 | 3/58 | Germany. |

ROY LAKE, *Primary Examiner.*

RUDOLPH V. ROLINEC, NATHAN KAUFMAN, *Examiners.*